United States Patent [19]
Mathews et al.

[11] Patent Number: 5,393,683
[45] Date of Patent: Feb. 28, 1995

[54] METHOD OF MAKING SEMICONDUCTOR DEVICES HAVING TWO-LAYER GATE STRUCTURE

[75] Inventors: Viju K. Mathews; Charles H. Dennison; Pierre Fazan; Roy Maddox; Akram Ditali, all of Boise, Id.

[73] Assignee: Micron Technology, Inc., Boise, Id.

[21] Appl. No.: 887,785

[22] Filed: May 26, 1992

[51] Int. Cl.[6] .......................................... H01L 21/265
[52] U.S. Cl. ....................................... 437/42; 437/52;
    437/913; 257/213
[58] Field of Search ............................ 437/42, 52, 913;
    257/213

[56] References Cited

U.S. PATENT DOCUMENTS

| | | | |
|---|---|---|---|
| 4,017,888 | 4/1977 | Christie | 437/42 |
| 4,257,832 | 3/1981 | Schwabe et al. | 437/42 |
| 4,264,376 | 4/1981 | Yatsuda et al. | 437/42 |
| 4,266,985 | 5/1981 | Ito et al. | 437/42 |
| 4,305,086 | 12/1981 | Khajezadeh | 437/42 |
| 4,849,366 | 7/1989 | Hsu et al. | 437/42 |
| 5,034,795 | 7/1991 | Ohsima | 257/324 |
| 5,063,431 | 11/1991 | Ohsima | 457/316 |

FOREIGN PATENT DOCUMENTS 0079625 4/1987 Japan ............................. 437/42

OTHER PUBLICATIONS

Hwang et al., "Electrical characteristics of ultrathin oxynitride gate dielectric prepared by rapid thermal oxidation of Si in $N_2O$." Appl. Phys. Lett., vol. 57, No. 10, 1010–1011 (Sep. 1990).

Ahn et al., "High Quality Ultrathin Gate Dielectrics Formation by Thermal Oxidation of Si in $N_2O$." J. Electrochem. Soc., vol. 138, No. 9, 39–41 (Sep. 1991).

*Primary Examiner*—Olik Chaudhuri
*Assistant Examiner*—Long Pham
*Attorney, Agent, or Firm*—Stoel Rives Boley Jones & Grey

[57] ABSTRACT

The present invention includes a method of forming semiconductor oxide layers and, in particular, gate oxide layers, in MOS semiconductor devices formed on silicon substrates. The method includes the steps of forming a first silicon oxide sublayer on the silicon substrate in an atmosphere including primarily oxygen, and forming a second silicon oxide sublayer over the first sublayer in an atmosphere including primarily nitrous oxide ($N_2O$). Preferably, the first and second sublayers represent 80 percent and 20 percent, respectively, of the silicon oxide layer.

19 Claims, 2 Drawing Sheets

5,393,683

METHOD OF MAKING SEMICONDUCTOR DEVICES HAVING TWO-LAYER GATE STRUCTURE

TECHNICAL FIELD

The present invention relates to metal-oxide-semiconductor ("MOS") semiconductor devices and, in particular, to the semiconductor oxide layer that isolates the components of such devices.

BACKGROUND OF THE INVENTION

FIG. 1 is a simplified sectional view of an exemplary prior art n-channel MOS field-effect transistor 10 formed on a p-type semiconductor substrate 12. A n+-type source 14 and a n+-type drain 16 extend into substrate 12. A polysilicon gate 18 is positioned on a gate oxide layer 20 formed on substrate 12 between source 14 and drain 16. A field oxide layer 22 formed on substrate 12 encircles transistor 10 and electrically insulates it from adjacent devices on substrate 12. Typically, substrate 12 is primarily monocrystalline silicon, and gate oxide layer 20 is primarily silicon dioxide ($SiO_2$).

Gate oxide layer 20 is typically formed by thermal oxidation of substrate 12 in a substantially pure oxygen atmosphere. In MOS VLSI circuits, however, such gate oxide layers 20 can exhibit undesirable characteristics such as, for example, relatively high defect densities and charge trapping, and relatively low reliability and resistance to hot-carrier effects (e.g., variations in transconductance and threshold voltage caused by hot-carrier stressing).

Improved gate oxide layers 20 have been formed by rapid thermal processing of substrate 12 in a nitrous oxide ($N_2O$) atmosphere. These improved gate oxide layers 20 are highly resistant to hot-carrier effects and exhibit reduced electron trapping, but have unacceptable thickness and compositional nonuniformities. Thickness and compositional uniformity are improved when gate oxide layers 20 are grown in a nitrous oxide atmosphere using conventional thermal processes. For example, gate oxide layers 20 with thicknesses of up to about 6.5 nm have been grown at temperatures between 950° C. and 1000° C.

Conventional thermal growth of silicon dioxide in a nitrous oxide atmosphere occurs at a relatively low rate and is self-limiting at temperatures in the 950° C.–1000° C. range. As a consequence, an increased oxidation period at these temperatures is incapable of growing an oxide layer to a thickness greater than about 6.5 nm, thereby requiring higher oxidation temperatures to grow thicker layers. For example, a gate oxide layer 20 with a thickness of 12 nm can be formed in nitrous oxide at an oxidation temperature of 1057° C. over a period of about 180 minutes.

A gate oxide layer 20 with a thickness of about 12 nm is advantageous in, for example, 64 Mbit dynamic random-access memory (DRAM) integrated circuits. However, transistors 10 with gate oxide layers 20 formed in a nitrous oxide atmosphere at a temperature of 1057° C. have severe junction leakage characteristics. As a consequence, these gate oxide layers 20 are unacceptable for MOS semiconductor devices such as 64 Mbit DRAM integrated circuits.

SUMMARY OF THE INVENTION

An object of the present invention is, therefore, to provide a method of forming semiconductor oxide layers.

Another object of this invention is to provide such a method for forming gate oxide layers in MOS semiconductor devices.

A further object of this invention is to provide such a method for forming gate oxide layers to reduce junction leakage characteristics of MOS semiconductor devices.

Yet another object of this invention is to provide an improved MOS semiconductor device gate oxide layer.

The present invention includes a method of forming semiconductor oxide layers and, in particular, gate oxide layers in MOS semiconductor devices formed on silicon substrates. The method includes the steps of forming a first semiconductor oxide sublayer on the silicon substrate in an atmosphere including primarily oxygen, and forming a second semiconductor oxide sublayer over the first sublayer in an atmosphere including primarily nitrous oxide ($N_2O$). Preferably, the first and second sublayers have thicknesses of about 80 percent and 20 percent, respectively, of the total thickness of the semiconductor oxide layer.

In a MOS semiconductor device such as, for example, an n-channel MOS field-effect transistor, an oxide layer of the present invention may be formed as a gate oxide layer to separate the transistor gate from the transistor source and drain. Such a gate oxide layer exhibits relatively low defect densities and charge trapping, and relatively high reliability, thickness uniformity. Moreover, an MOS field-effect transistor with such a gate oxide layer has relatively high resistance to hot carrier effects and relatively low junction leakage, even when formed to thicknesses greater than about 6.5 nm. Accordingly, a gate oxide layer formed in accordance with the present invention is desirable for MOS VLSI circuits such as 64 Mbit DRAM integrated circuits.

Additional objects and advantages of the present invention will be apparent from the following detailed description of a preferred embodiment thereof, which proceeds with reference to the accompanying drawings.

DETAILED DESCRIPTION OF PREFERRED EMBODIMENT

Figure 2:
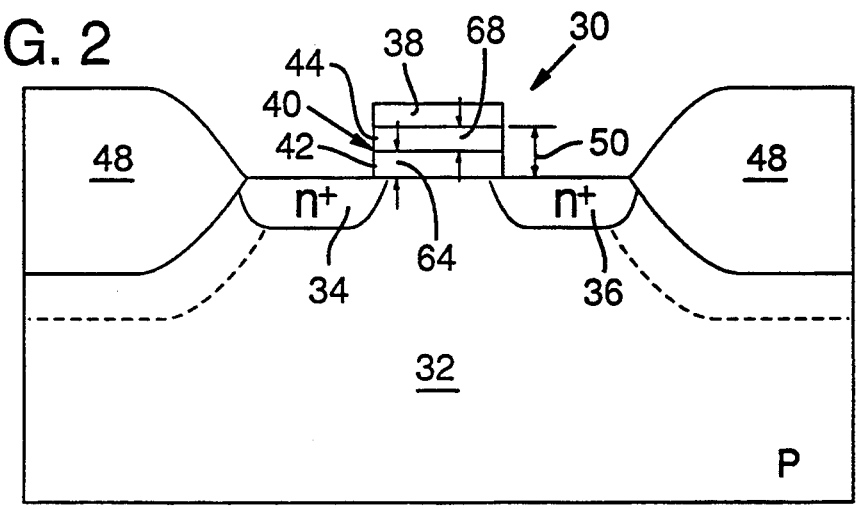
FIG. 2 is a sectional view of a n-channel MOS field-effect transistor with a gate oxide layer formed in accordance with the present invention.

FIG. 2 is a simplified sectional view of an n-channel metal-oxide-semiconductor ("MOS") field-effect transistor 30 formed on a p-type semiconductor substrate 32. It will be appreciated that n-channel transistor 30 is referred to for purposes of explanation and that the present invention is similarly applicable to other types of MOS devices, including complementary MOS devices.

Transistor 30 includes n+-type source 34 and a n+-type drain 36 that extend into semiconductor substrate 32. A polysilicon gate 38 is positioned on a gate oxide layer 40 formed on substrate 32 between gate 34 and drain 36. Gate oxide layer 40 includes first and second sublayers 42 and 44 in accordance with the present invention. A field oxide layer 48 formed on substrate 32 encircles transistor 30 and electrically insulates it from adjacent devices on substrate 32.

Preferably, substrate 32 is primarily monocrystalline silicon, gate oxide layer 40 is primarily silicon dioxide ($SiO_2$), and gate oxide layer 40 has a thickness 50 greater than about 6.5 nm. For example, a 64 Mbit dynamic random-access memory (DRAM) integrated circuit would employ a gate oxide layer 40 with a thickness 50 of about 12 nm.

Figure 3:
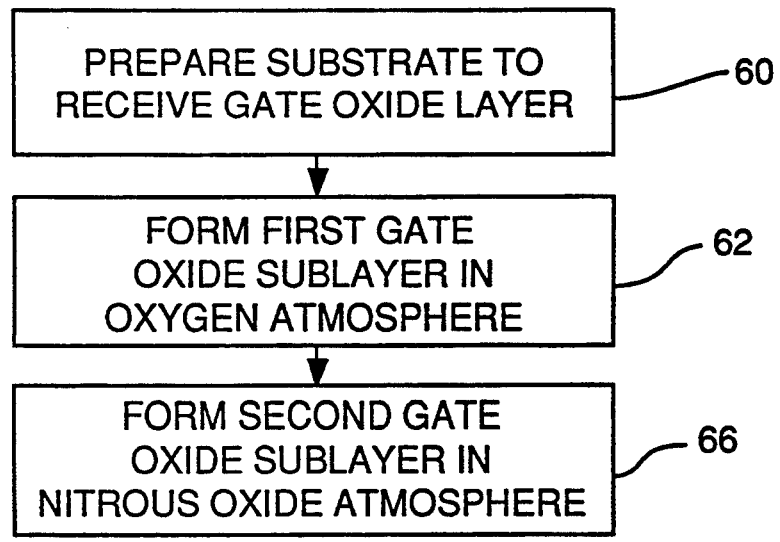
FIG. 3 is a flow diagram showing process steps for forming a semiconductor oxide layer in accordance with the present invention.

FIG. 3 is a flow diagram showing process steps for growing gate oxide layer 40. Process block 60 indicates that substrate 30 is prepared in a conventional manner to receive gate oxide layer 40. For example, substrate 30 may be a p-type lightly doped (e.g., $10^{15} cm^{-3}$), <100>-oriented, polished silicon wafer having a field oxide layer 48 with a pattern of transistor locations etched into it by conventional etching processes.

Process block 62 indicates that first gate oxide sublayer 42 is formed on substrate 30 in an atmosphere of substantially pure oxygen (e.g., 99.99 percent) or argon-diluted oxygen (e.g., 16 percent oxygen in argon) in a standard furnace. First gate oxide sublayer 42 is formed to a thickness 64 of between about 75 percent and 92 percent, preferably about 83 percent, of thickness 50 of gate oxide layer 40. For gate oxide layer 40 with an exemplary thickness 50 of 12 nm, first sublayer 42 is formed to a thickness 64 of 10 nm over a period of about 25 minutes in an atmosphere of 16 percent oxygen in argon and an oxidation temperature of about 907° C. Substrate 30 is heated from about room temperature to the oxidation temperature at a rate of about 8–10° C./min.

Process block 66 indicates that second gate oxide sublayer 44 is formed on first gate oxide sublayer 42 in an atmosphere of substantially pure nitrous oxide (e.g., 99.998 percent) to a thickness 68 of between about 8 percent and 25 percent, preferably about 17 percent, of thickness 50 of gate oxide layer 40. For gate oxide layer 40 with an exemplary thickness 50 of 12 nm, second sublayer 44 is formed to a thickness 68 of 2.0 nm over a period of about 10 minutes in an atmosphere of substantially pure nitrous oxide at a flow rate of about 5000 sccm and an oxidation temperature of about 1057° C.

After first gate oxide sublayer 42 is formed, the oxygen atmosphere used in step 62 is purged with nitrogen. Substrate 30 is then heated to the oxidation temperature of step 66 at a rate of 10° C./min. At the oxidation temperature, nitrous oxide is introduced into the furnace. After second gate oxide sublayer 44 is formed in step 66, substrate 30 is cooled to about room temperature at a rate of 3.8° C./min and the nitrous oxide atmosphere is purged with nitrogen.

Gate oxide layer 40 with thickness 50 of greater than 6.5 nm exhibits superior semiconductor device characteristics such as, for example, decreased defect density and charge trapping and increased reliability, radiation hardness, thickness uniformity, and barrier performance against diffusion of impurities. Moreover, transistor 30 with gate oxide layer 40 exhibits relatively low junction leakage characteristics.

Figure 1:
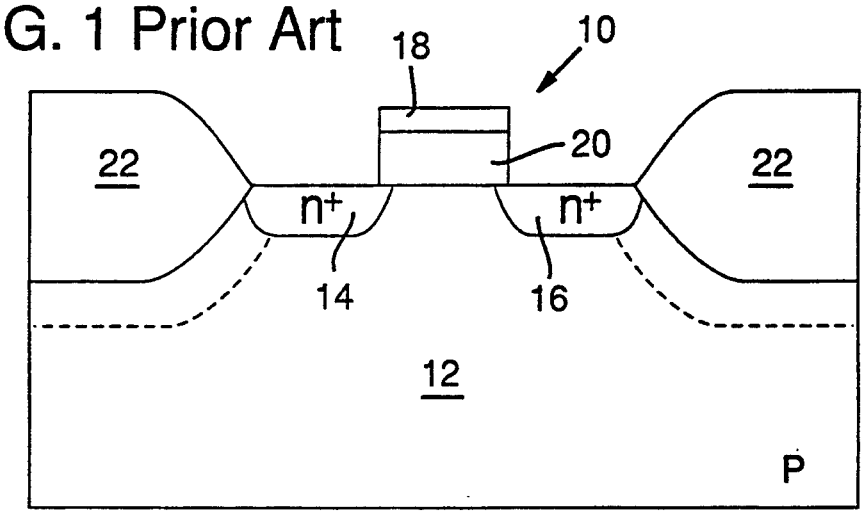
FIG. 1 is a sectional view of a prior art n-channel MOS field-effect transistor.
Figure 4:
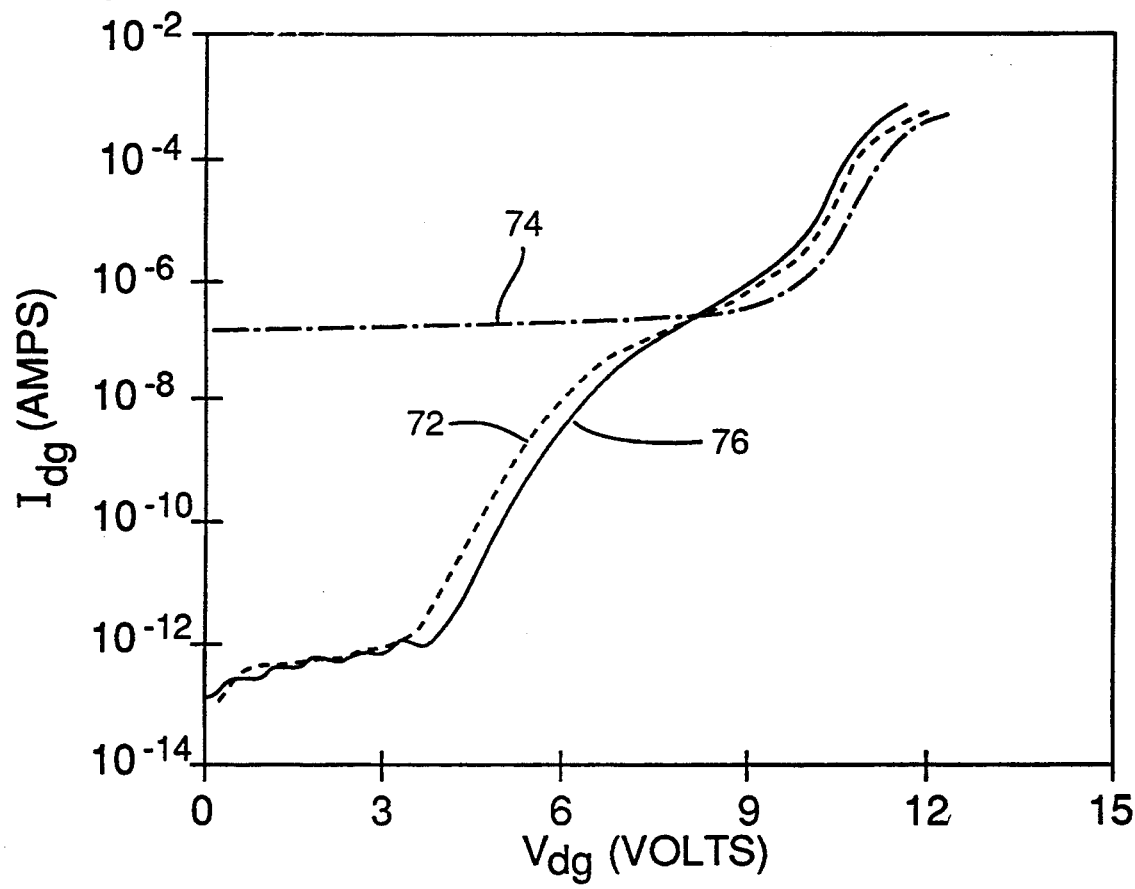
FIG. 4 is a graph showing junction leakage characteristics for field-effect transistors with gate oxide layers formed in accordance with the present invention and in accordance with conventional methods.

FIG. 4 is a graph showing junction leakage characteristics for prior art transistor 10 with gate oxide layer 20 (FIG. 1) and transistor 30 with gate oxide layer 40. In particular, FIG. 4 shows the drain-gate current $I_{dg}$ of transistors 10 and 30 for various drain-gate voltages $V_{dg}$.

Graph 72 represents the junction leakage characteristics of prior art transistor 10 with a conventional gate oxide 20 grown to a thickness of 12 nm in an atmosphere of argon-diluted oxygen at a temperature of 907° C. over a period of 30 minutes. Although the junction leakage characteristics represented by graph 72 are acceptable, such a gate oxide layer 20 would exhibit undesirable effects including increased defect density, charge trapping, and hot carrier effects, the latter of which are described below with reference to FIG. 5. These effects would render such a gate oxide layer 20 unacceptable in some VLSI MOS devices.

Graph 74 represents the junction leakage characteristics of alternative prior art transistor 10 with gate oxide layer 20 formed to a thickness of 12 nm in an atmosphere of nitrous oxide $N_2O$ at a temperature of 1057° C. over a period of 180 minutes. Such a gate oxide layer 20 exhibits leakage currents of more than 0.1 $\mu A$ at substantially all drain-gate voltages $V_{dg}$. A substantially constant leakage current of more than 0.1 $\mu A$ in, for example, MOS DRAM integrated circuits, would result in an unacceptably large standby current and excessive refresh cycling.

Graph 76 represents the junction leakage characteristics of transistor 30 with gate oxide layer 40 having a first sublayer 42 with a thickness 64 of about 10 nm and second sublayer 44 with a thickness 68 of about 2.0 nm. Transistor 30 exhibits junction leakage currents that are up to about 5 orders of magnitude lower than those exhibited by transistor 10 with a gate oxide layer 20 formed in a nitrous oxide atmosphere. Moreover, transistor 30 with gate oxide layer 40 is superior to transistor 10 with gate oxide layer 20 in several respects, including resistance to hot-carrier effects.

Figure 5:
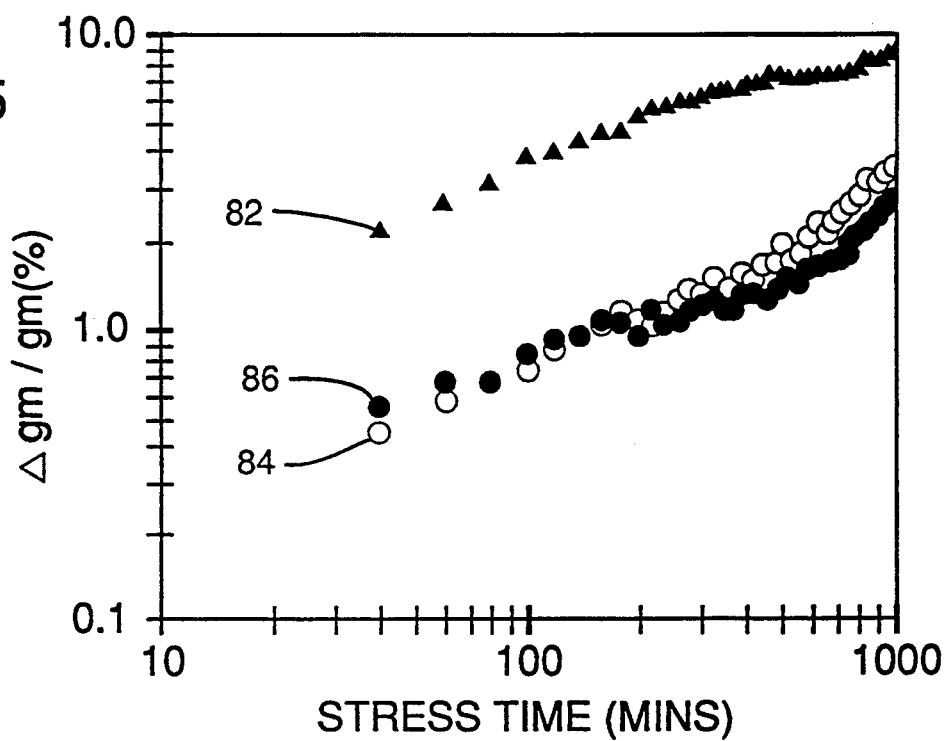
FIG. 5 is a graph showing transconductance characteristics for field-effect transistors with gate oxide layers formed in accordance with the present invention and in accordance with conventional methods.

FIG. 5 is a graph showing normalized changes in transconductance ($\Delta gm/gm$) over different stress periods for transistor 30 with gate oxide layer 40 and prior art transistor 10 with gate oxide layer 20 formed either in oxygen or nitrous oxide. Each of gate oxide layers 20 and 40 had a thickness of 12 nm, and each of transistors 10 and 30 was subjected to substrate currents of 280 $\mu A$ with applied gate and drain voltages of 2.5 volts and 6.75 volts, respectively.

Graphs 82 and 84 represent the normalized changes in transconductance under hot-carrier stressing for prior art transistor 10 with gate oxide layer 20 formed in respective oxygen and nitrous oxide atmospheres. Graph 86 represents the normalized changes in transconductance for transistor 30. As shown by graphs 82 and 86, transistor 10 with gate oxide layer 20 formed in oxygen undergoes transconductance variations that are several times larger than those for transistor 30. It will be appreciated, therefore, that transistor 30 with gate oxide layer 40 has combined performance capabilities superior to prior art transistor 10 with gate oxide layer 20 formed in either oxygen or nitrous oxide.

It will be obvious to those having skill in the art that many changes may be made in the above-described details of the preferred embodiment of the present invention without departing from the underlying principles thereof. The scope of the present invention should, therefore, be determined only by the following claims.

We claim:

1. A method of forming a gate oxide layer on a semiconductor substrate for a MOS semiconductor device, comprising the steps:
   forming a first gate oxide sublayer on the semiconductor substrate in a first atmosphere including primarily oxygen; and
   forming a second gate oxide sublayer having a thickness of about 0.95 nm to 3 nm, the second gate oxide sublayer being formed on the first oxide sublayer in a second atmosphere including primarily nitrous oxide.

2. The method of claim 1 in which the first gate oxide sublayer forms a predominant portion of the gate oxide layer.

3. The method of claim 2 in which the first oxide sublayer forms between about 75 percent and 92 percent of the gate oxide layer.

4. The method of claim 1 in which the first atmosphere includes substantially pure oxygen or argon-diluted oxygen.

5. The method of claim 1 in which the gate oxide layer has a thickness greater than about 6.5 nm.

6. The method of claim 1 in which the semiconductor substrate includes primarily silicon and the gate oxide includes primarily silicon dioxide.

7. A method of forming a composite gate oxide layer on a <100>-oriented lightly doped p-type substrate for a MOS semiconductor device, comprising:
   providing a first reaction atmosphere containing substantially oxygen;
   heating the substrate from about a room temp to a first reaction temperature;
   forming on the substrate a first gate oxide sublayer having a thickness of about 9 nm to 11 nm;
   heating the substrate from the first reaction temperature to a second reaction temperature;
   providing a second reaction atmosphere containing substantially nitrous oxide; and
   forming on the first gate oxide sublayer a second gate oxide sublayer having a thickness of about 0.95 nm to 3 nm.

8. The method of claim 7 further including the step of diluting the first reaction atmosphere with Argon such that the first reaction atmosphere contains about 16 percent oxygen.

9. The method of claim 7 in which the heating from room temperature to the first reaction temperature step is carried out at a rate of about 8° C./minute to about 10° C./minute and the first reaction temperature is about 907° C.

10. The method of claim 7 in which the first oxide sublayer forming step has a duration of about 25 minutes such that the first sublayer thickness is about 10 nm.

11. The method of claim 7 in which each forming step is followed by a step of purging the reaction atmosphere with nitrogen.

12. The method of claim 7 in which the heating from the first reaction temperature to the second reaction temperature step is carried out at a rate of about 10° C./minute and the second reaction temperature is greater than about 1000° C.

13. The method of claim 9 in which the second reaction atmosphere is about 99.9 percent nitrous oxide.

14. The method of claim 7 in which the second oxide sublayer forming step has a duration of about 10 minutes such that the first sublayer thickness is about 2.0 nm.

15. The method of claim 7 in which the second gate oxide forming step is followed by a step of cooling the substrate from to the second reaction temperature to room temperature at a rate of about 3.8° C./minute.

16. A method of forming a gate oxide layer of a selected thickness on a semiconductor substrate for a MOS semiconductor device, comprising the steps:
   forming a first gate oxide sublayer on the semiconductor substrate in a first atmosphere including primarily oxygen; and
   forming a second gate oxide sublayer on the first oxide sublayer in a second atmosphere including primarily nitrous oxide, the first gate oxide sublayer having a thickness of between about 75 and 92 percent the selected thickness of the gate oxide layer and the second gate oxide sublayer having a corresponding thickness of between about 25 percent and 8 percent of the selected thickness.

17. The method of claim 16 in which the first atmosphere includes substantially pure oxygen or argon-diluted oxygen.

18. The method of claim 16 in which the selected thickness of the gate oxide layer is greater than about 6.5 nm.

19. The method of claim 16 in which the semiconductor substrate includes primarily silicon and the gate oxide includes primarily silicon dioxide.

* * * * *

UNITED STATES PATENT AND TRADEMARK OFFICE
CERTIFICATE OF CORRECTION

PATENT NO. : 5,393,683
DATED : February 28, 1995
INVENTOR(S) : Viju K. Mathews, Charles H. Dennison, Pierre Fazan, Roy Maddox, and Akram Ditali It is certified that error appears in the above-indentified patent and that said Letters Patent is hereby corrected as shown below:

Column 6, line 19, change "claim 9" to --claim 7--.

Column 6, line 26, change "from to the second" to --from the second--.

Column 6, line 38, change "92 percent the" to --92 percent of the--.

Signed and Sealed this

Nineteenth Day of September, 1995

Attest:

*Bruce Lehman*

BRUCE LEHMAN

*Attesting Officer*     *Commissioner of Patents and Trademarks*